(12) United States Patent
Tsai et al.

(10) Patent No.: US 11,387,363 B2
(45) Date of Patent: *Jul. 12, 2022

(54) SOURCE/DRAIN JUNCTION FORMATION

(71) Applicant: Taiwan Semiconductor Manufacturing Co., Ltd., Hsinchu (TW)

(72) Inventors: Chun Hsiung Tsai, Xinpu Township (TW); Sheng-Wen Yu, New Taipei (TW); Ziwei Fang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 7 days.

This patent is subject to a terminal disclaimer.

(21) Appl. No.: 16/933,255

(22) Filed: Jul. 20, 2020

(65) Prior Publication Data

US 2020/0350430 A1 Nov. 5, 2020

Related U.S. Application Data

(63) Continuation of application No. 16/222,259, filed on Dec. 17, 2018, now Pat. No. 10,720,529, which is a
(Continued)

(51) Int. Cl.
| | |
|---|---|
| *H01L 29/78* | (2006.01) |
| *H01L 29/08* | (2006.01) |
| *H01L 21/265* | (2006.01) |
| *H01L 29/66* | (2006.01) |
| *H01L 29/165* | (2006.01) |

(52) U.S. Cl.
CPC ...... *H01L 29/785* (2013.01); *H01L 21/26506* (2013.01); *H01L 21/26513* (2013.01); *H01L 29/0847* (2013.01); *H01L 29/165* (2013.01); *H01L 29/66636* (2013.01);
(Continued)

(58) Field of Classification Search
None
See application file for complete search history.

(56) References Cited

U.S. PATENT DOCUMENTS

| | | |
|---|---|---|
| 6,306,737 B1 | 10/2001 | Mehrad et al. |
| 9,722,083 B2 * | 8/2017 | Tsai .............. H01L 29/0847 |

(Continued)

OTHER PUBLICATIONS

Dvurechenskii, et al., "Transport phenomena in amorphous silicon doped by implantation of 3d metals," Physica Status Solidi, Jun. 16, 1986, vol. 95, Issue 2, pp. 635-640.
(Continued)

*Primary Examiner* — Xiaoming Liu
(74) *Attorney, Agent, or Firm* — Slater Matsil, LLP

(57) ABSTRACT

A method includes forming a first channel region and a first gate structure formed over the first channel region. A first source/drain region is formed adjacent the first channel region and the first source/drain region includes a crystalline structure doped with a first dopant. A first silicide is formed over the first source/drain region. The first source/drain region includes a first concentration of the first dopant between $2.0 \times 10^{21}$ atoms per centimeter cubed and $4.0 \times 10^{21}$ atoms per centimeter cubed at a depth of 8 to 10 nanometers.

20 Claims, 8 Drawing Sheets

Related U.S. Application Data continuation of application No. 15/664,436, filed on Jul. 31, 2017, now Pat. No. 10,158,019, which is a continuation of application No. 14/056,711, filed on Oct. 17, 2013, now Pat. No. 9,722,083.

(52) U.S. Cl.
CPC .. *H01L 29/66795* (2013.01); *H01L 29/66803* (2013.01); *H01L 29/665* (2013.01)

(56) References Cited

U.S. PATENT DOCUMENTS

| | | | |
|---|---|---|---|
| 10,720,529 B2 * | 7/2020 | Tsai | ............... H01L 21/26506 |
| 2006/0289799 A1 | 12/2006 | Fang et al. | |
| 2007/0293056 A1 | 12/2007 | Setsuhara et al. | |
| 2008/0194086 A1 | 8/2008 | Sasaki et al. | |
| 2008/0268624 A1 | 10/2008 | Kwak et al. | |
| 2009/0035878 A1 | 2/2009 | Sasaki et al. | |
| 2009/0035911 A1 | 2/2009 | Rachmady et al. | |
| 2009/0085035 A1 | 4/2009 | Giles | |
| 2009/0114957 A1 | 5/2009 | Hwang | |
| 2009/0142900 A1 | 6/2009 | Wiatr et al. | |
| 2009/0191684 A1 | 7/2009 | Shue et al. | |
| 2010/0041218 A1 | 2/2010 | Hatem et al. | |
| 2010/0330755 A1 | 12/2010 | Hsiao et al. | |
| 2011/0312145 A1 | 12/2011 | Tsai et al. | |
| 2012/0043644 A1 | 2/2012 | Ono et al. | |
| 2012/0068193 A1 | 3/2012 | Chan et al. | |
| 2012/0112292 A1 | 5/2012 | Lavoie et al. | |
| 2012/0196453 A1 | 8/2012 | Alford | |
| 2017/0330963 A1 | 11/2017 | Tsai et al. | |

OTHER PUBLICATIONS

Tian, "Microwave based technique for ultra-fast and ultra-high temperature thermal processing of compound semiconductors and nano-schale Si semiconductors," IEEE, 17th International Conference on Advanced Thermal Processing of Semiconductors, 2009, RTP '09, E-ISBN: 978-1-4244-3815-0.

* cited by examiner

SOURCE/DRAIN JUNCTION FORMATION

PRIORITY CLAIM AND CROSS-REFERENCE

This application is a continuation of U.S. patent application Ser. No. 16/222,259, entitled "Source/Drain Junction Formation," filed Dec. 17, 2018, which is a continuation of U.S. patent application Ser. No. 15/664,436, entitled "Source/Drain Junction Formation," filed Jul. 31, 2017 (now U.S. Pat. No. 10,158,019, issued Dec. 18, 2018), which is a continuation of U.S. patent application Ser. No. 14/056,711, entitled, "Source/Drain Junction Formation," filed on Oct. 17, 2013, (now U.S. Pat. No. 9,722,083, issued Aug. 1, 2017), which application is hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors are used in sub 32 nm transistor nodes. FinFETs not only improve areal density, but also improve gate control of the channel.

Unfortunately, as FinFETs become smaller and smaller, the processing steps used to fabricate the FinFETs may produce undesirable and unintended consequences. For example, the method of forming the source and drain regions in a FET or a FinFET may negatively impact the device or the device yield.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely a FinFET metal oxide semiconductor (MOS). The concept may also be applied, however, to other integrated circuits and electronic structures including, but not limited to, a planar field-effect transistor (FET), a multiple gate field-effect transistor (MuGFET), and nanowire devices.

Figure 1:
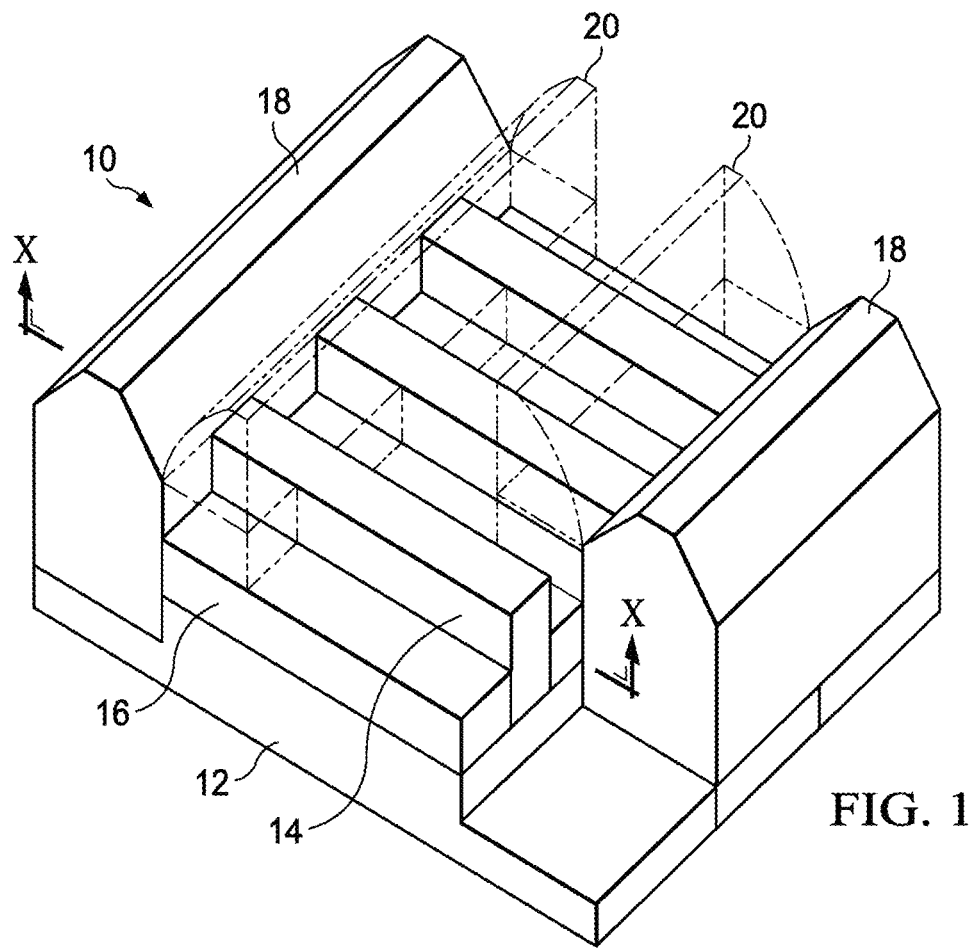
FIG. 1 is a perspective view of a basic FinFET device having portions cut away for the purpose of illustration.
Figure 2:
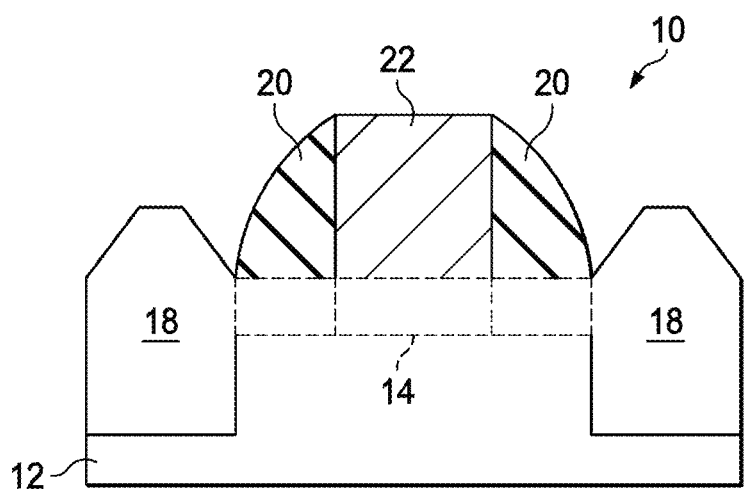
FIG. 2 is a cross section of the basic FinFET device of FIG. 1 taken generally along line x-x.

FIGS. 1-2 represent a FinFET 10 in accordance with an embodiment, which will be briefly described. The FinFET 10 includes a substrate 12 supporting several fins 14, which are at least partially embedded in isolation regions 16. In an embodiment, the isolation regions 16 comprise shallow trench isolation (STI) regions. The substrate 12 may be formed from bulk silicon, silicon, germanium, silicon germanium, a silicon-containing material, silicon-on-insulator (SOI), or another suitable semiconductor material. In an embodiment, the semiconductor substrate 12 is a p-type substrate.

The fins 14 generally extend between source/drain regions 18 of the FinFET 10. The fins 14 may be formed from, for example, silicon, germanium, silicon germanium, a silicon-containing material, or another suitable fin material. The gate electrode structure 22 of FIGS. 1-2 may include several discrete layers or components such as, for example, an interfacial oxide layer, a high-k-dielectric layer, and a metal gate layer. Spacers 20, which are stacked upon a portion of the fins 14 adjacent the source/drain regions 18 and may be formed from a nitride (e.g., $Si_3N_4$), are disposed on opposing sides of a gate electrode structure 22 depicted in FIG. 2. As discussed below, source/drain regions 18 are formed having an ultra shallow junction. One of the challenges in forming an ultra shallow junction (e.g., a p-n junction) in the source/drain region of a device is minimizing the sheet resistance (Rs) for a given junction depth (Xj). Embodiments of the process disclosed herein permit formation of the ultra shallow junction while providing a suitably low sheet resistance.

As will be more fully explained below, FIGS. 3-8 collectively illustrate an embodiment process flow for forming a source/drain region in an NMOS FinFET device and FIGS. 9-13 collectively illustrate an embodiment process flow for forming a source/drain region in an PMOS FinFET device. The process flows described herein may be also be used to form source/drain regions in other semiconductor devices (e.g., a planar FET, a MuGFET, etc.).

Figure 3:
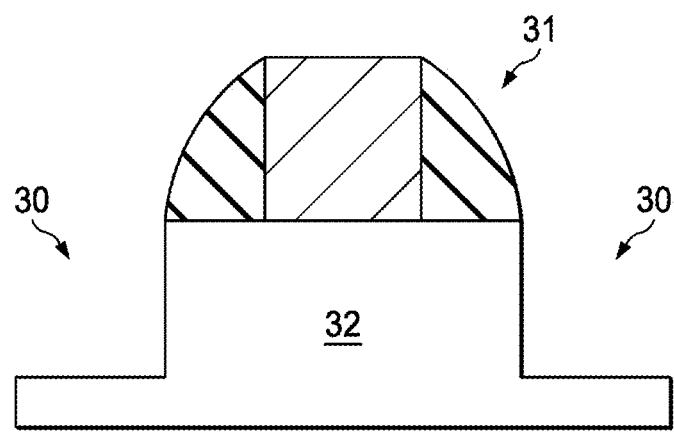
FIGS. 3-8 collectively illustrate an embodiment process flow for forming a source/drain region for a FinFET.

As shown in FIG. 3, recesses 30 are formed in a substrate 32. As will be more fully explained below, the recesses 30 represent areas where source and drain regions of the device will eventually be formed. In an embodiment, the recesses 30 may be formed through, for example, an etching or other suitable process. As shown, portions of the substrate 32 between the recesses 30 may be protected by, for example, a protective feature 31 such as, for example, a dummy gate, a mask, a resist, spacers, and so on. In other words, the protective feature 31 protects what will eventually be the channel region of the device.

The substrate 32 may be formed from bulk silicon, silicon, germanium, silicon germanium, a silicon-containing material, silicon-on-insulator (SOI), or another suitable semiconductor material. In an embodiment, the semiconductor substrate 32 is either a p-type substrate or an n-type substrate and may include one or more p-type or n-type wells therein.

Figure 4:
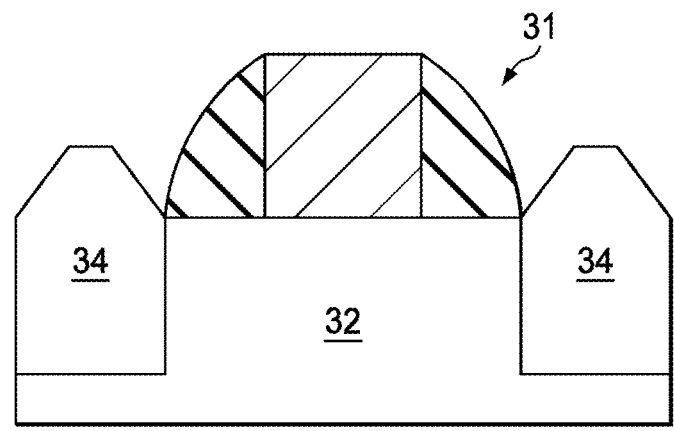

Referring now to FIGS. 3-4, an n-type semiconductor material 34 is formed in the recesses 30 using an epitaxy process. In an embodiment, the n-type semiconductor material comprises silicon phosphorous (SiP). In an embodiment, the n-type semiconductor material comprises silicon phosphorous having a concentration of less than about $1 \times 10^{20}$ atoms per centimeter cubed to about $7 \times 10^{20}$ atoms per centimeter cubed.

Figure 5:
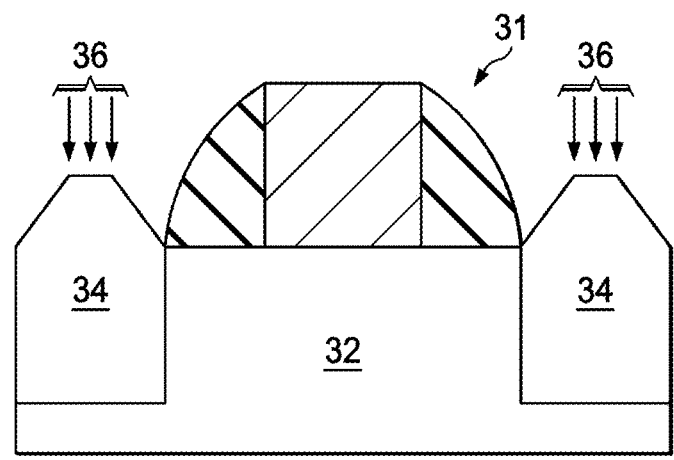

Thereafter, and as shown in FIG. 5, a pre-amorphization doping of the n-type semiconductor material 34 is performed using helium (He) and a plasma doping (PLAD) 36. As used herein, the pre-amorphization doping may be referred to as a pre-amorphization implant (PAI). In an embodiment, the plasma doping of the helium may act as or provide a buffer layer to retard or prevent post-plasma doping diffusion of a phosphorous dopant, which will be discussed below.

In an embodiment, the plasma doping 36 of the helium is performed at an energy of between about 0.4 kiloelectron-volts (keV) about 1.0 kiloelectron-volts. In an embodiment, the plasma doping 36 of the helium is performed using a variable energy to prevent bubble defects in the n-type semiconductor material 34. Bubble defects, which are undesirable pockets of gas in the semiconductor material 34, may occur if, for example, a depth of the doping is too great (e.g., greater than about 10 to 20 nm) and the doping energy remains constant.

By way of example, the energy of the plasma doping 36 may be linearly increased from 0.4 kiloelectron-volts (keV) to about 1.0 kiloelectron-volts, linearly decreased from 1.0 kiloelectron-volts (keV) to about 0.4 kiloelectron-volts, or otherwise varied during the doping process. In an embodiment, a dose of the helium is between about $1.0 \times 10^{16}$ atoms per centimeter squared and about $2.0 \times 10^{16}$ atoms per centimeter squared.

In an embodiment, a concentration of the helium in the n-type semiconductor material 34 after the doping by plasma doping 36 is between about ten percent to about 60 percent of the PLAD dose.

Figure 6:
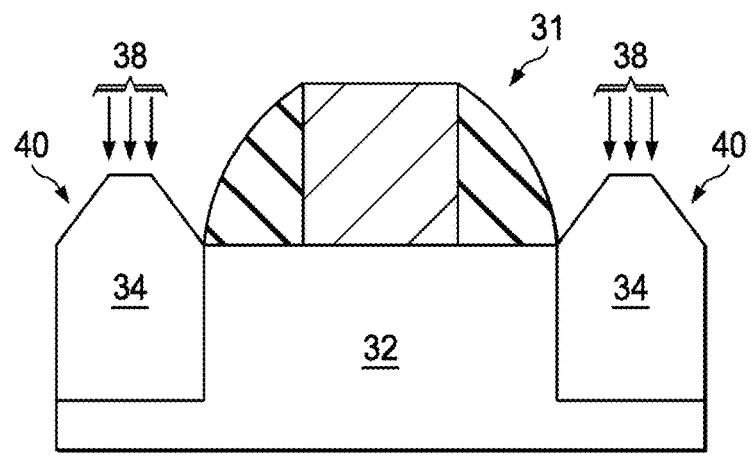

Next, as shown in FIG. 6, a doping of phosphorous (P) into the n-type semiconductor material 34 is performed using plasma doping 38 in order to form a source/drain region 40. In an embodiment, phosphorus is doped in the n-type semiconductor material 34 utilizing about 0.5% $PH_3$ and about 99.5% $H_2$. In an embodiment, the plasma doping 38 of the phosphorous is performed at a constant energy of between about 2 kiloelectron-volts (keV) and about 10 kiloelectron-volts (keV). The phosphrous (P) plasma doping may be performed with or without pre PLAD He amorphization doping.

In an embodiment, the plasma doping 38 of the phosphorous is performed with a variable energy to prevent bubble defects in the n-type semiconductor material 34. In an embodiment, the plasma doping 38 of the phosphorous is performed with a variable energy of about 5 kiloelectron-volts (keV) to about 3 kiloelectron-volts (keV). In an embodiment, the plasma doping 38 of the phosphorous is performed with a variable energy of about 6 kiloelectron-volts (keV) to about 4 kiloelectron-volts (keV). The energy of the plasma doping 36 may be linearly increased from 3 kiloelectron-volts (keV) to about 5 kiloelectron-volts (keV), linearly decreased from 6 kiloelectron-volts (keV) about 4 kiloelectron-volts, or otherwise varied during the doping process.

In an embodiment, a dose of the phosphorus is between about $1 \times 10^{16}$ atoms per centimeter squared to $2 \times 10^{16}$ atoms per centimeter squared. In an embodiment, a collective process time of the plasma doping 36 in FIG. 5 and the plasma doping 38 of FIG. 6 is less than about thirty (30) seconds.

Figure 7:
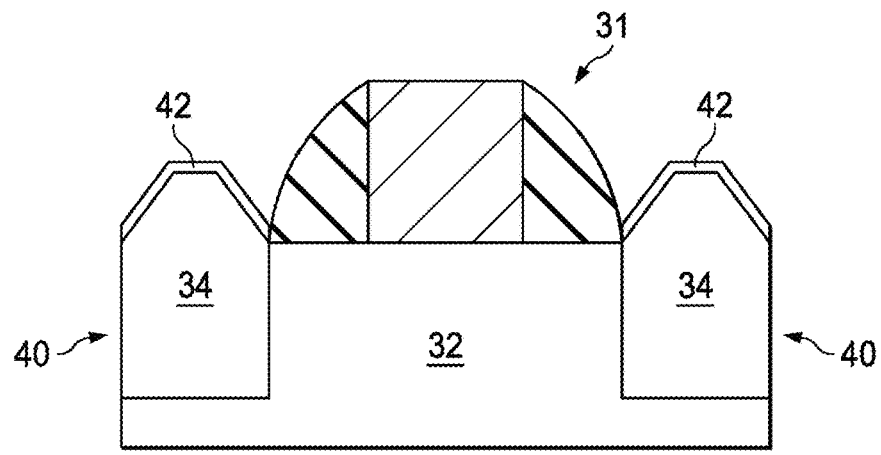

After the phosphorus doping 38 has been performed, a silicide layer 42 is formed over the source/drain region 40 as shown in FIG. 7. In an embodiment, a high K loop and an OLD loop process are performed before the silicide layer 42 is formed. However, for the sake of brevity, these processes have not been illustrated or explained in detail. In an embodiment, the silicide layer 42 has a depth of about eight to about twelve nanometers. The silicide layer 42 may have other depths in other embodiments or in other devices.

In an embodiment, a concentration of the phosphorus in the source/drain region 40 beneath the silicide layer 42 is between about $2.0 \times 10^{21}$ atoms per centimeter cubed and about $4.0 \times 10^{21}$ atoms per centimeter cubed. In other words, the concentration of the phosphorus at the interface of the bottom surface of the silicide layer 42 and top surface of the underlying source/drain material 34 is between about $2.0 \times 10^{21}$ atoms per centimeter cubed and about $4.0 \times 10^{21}$ atoms per centimeter cubed.

After the silicide layer 42 has been formed, an anneal process is performed. As will be more fully explained below, the anneal process permits portions of the source/drain regions 40 damaged during doping to be recrystallized or repaired.

In an embodiment, the anneal process comprises a millisecond anneal. In an embodiment, the millisecond anneal is performed using a laser anneal (LSA), at a temperature of about 900° C. to about 1200° C., and for a time of about 10 microseconds (μs) to about 2 milliseconds (ms). In an embodiment, the millisecond anneal is performed using a flash anneal (uSSA), at a temperature of about 700° C. to about 1000° C., and for a time of about 0.8 ms to about 5 ms.

In an embodiment, the anneal process comprises a microwave anneal. Microwave annealing of layers in semiconductors is an application of thermal processing of semiconductors, with low processing temperature eliminating unwanted diffusion as one of the potential advantages. In an embodiment, the microwave anneal is performed using a free carrier absorption technique. In an embodiment, the microwave anneal is performed using a dipolar polarization or/and interfacial polarization heating. In an embodiment, the microwave anneal is performed at a temperature of about 300° C. to about 600° C., and for a time of about 30 seconds to about 300 seconds.

In an embodiment, the pre-amorphization doping permits the anneal process to be performed at a relatively low temperature such as, for example, between about 400° C. to about 600° C. Notably, when the pre-amorphization doping process is employed a more defect rich area will be formed, which will enhance the microwave reaction with the doped area.

Figure 8:
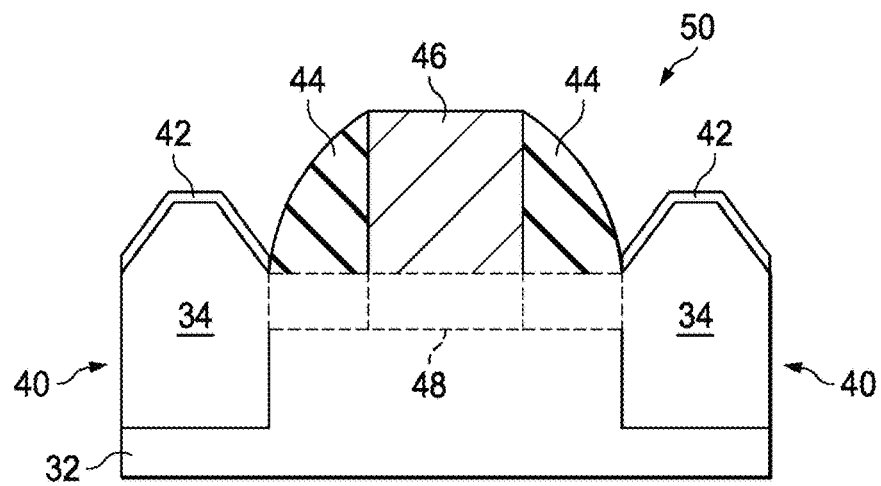

Thereafter, the protective feature 31 (e.g., the dummy gate) of FIG. 7 may be removed using a conventional removal process and then replaced with the metal gate or a gate electrode structure 46 as shown in FIG. 8 using a conventional gate formation process. As shown in FIG. 8, the gate electrode structure 46 and the spacers 44 are disposed over fins 48 adjacent the source/drain regions 40 to form a channel in the FinFET 50.

Those skilled in the art will recognized that further or additional processing steps may be taken to form the FinFET 50 of FIG. 8. In addition, the FinFET 50 of FIG. 8 may contain or include additional materials, features, and layers in different embodiments.

Figure 9:
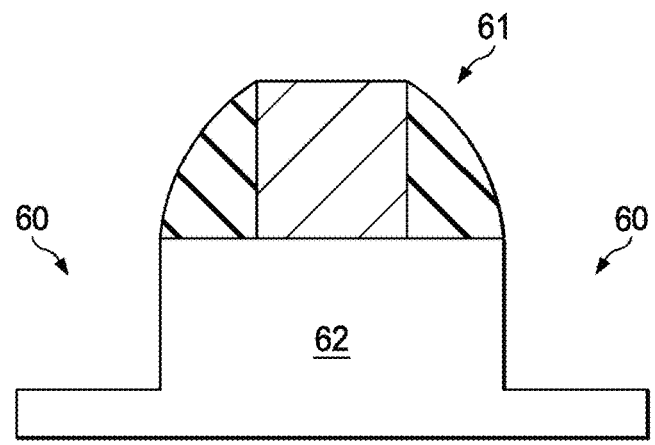
FIGS. 9-13 collectively illustrate an embodiment process flow for forming a source/drain region for a FinFET.

Referring now to FIGS. 9-13, an embodiment process flow for forming a source/drain region for a FinFET is collectively illustrated. The process flow may be also be used to form source/drain regions in other semiconductor devices (e.g., a planar FET, a MuGFET, etc.). As shown in FIG. 9, recesses 60 are formed in a substrate 62. As will be more fully explained below, the recesses 60 represent areas where source and drain regions of the device will eventually be formed. In an embodiment, the recesses 60 may be formed through, for example, an etching or other suitable process. As shown, portions of the substrate 62 between the recesses 60 may be protected by, for example, a protective feature 61 such as, for example, a dummy gate, a mask, a resist, and so on. In other words, the protective feature 61 protects what will eventually be the channel region of the device.

The substrate 62 may be formed from bulk silicon, silicon, germanium, silicon germanium, a silicon-containing material, silicon-on-insulator (SOI), or another suitable semiconductor material. In an embodiment, the semiconductor substrate 62 is either a p-type substrate or an n-type substrate and may include one or more p-type or n-type wells therein.

Figure 10:
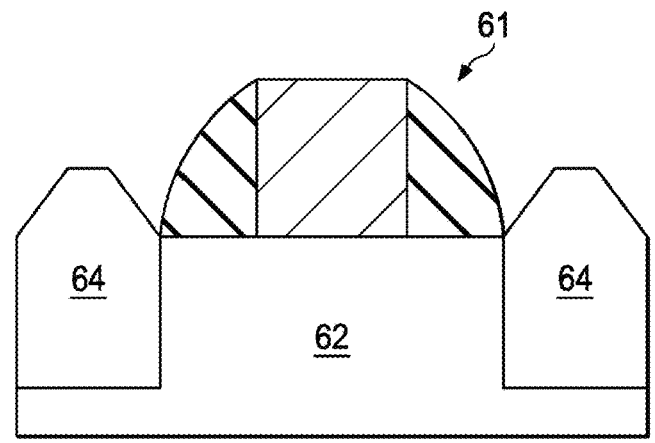

Referring now to FIGS. 9-10, a p-type semiconductor material 64 is formed in the recess 60 using an epitaxy process. In an embodiment, the p-type semiconductor material comprises silicon germanium boron (SiGeB).

Figure 11:
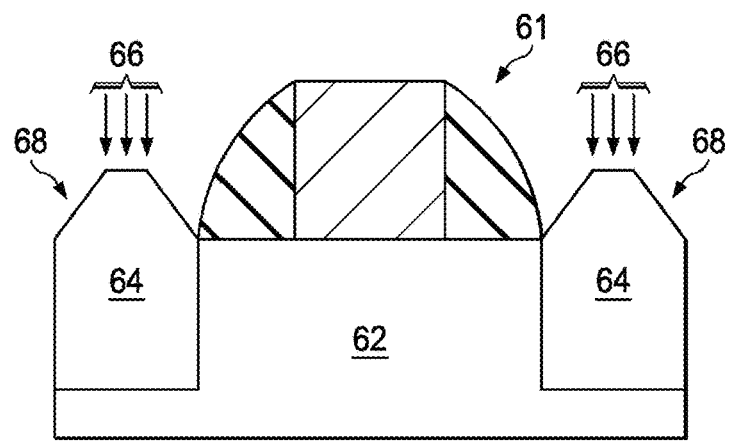

Thereafter, as shown in FIG. 11, a pre-amorphization doping boron (B) and helium (He) into the p-type semiconductor material 64 is performed simultaneously using plasma doping 66 to form a source/drain region 68. In an embodiment, the boron comprises $B_2H_6$. In an embodiment, the doping of boron and helium comprises about 0.3% to about 5% $B_2H_6$ and about 95% to about 99.7% helium. In an embodiment, the doping of boron and helium comprises about 0.5% $B_2H_6$ and about 99.5% helium.

In an embodiment, the plasma doping 66 of the boron and helium is performed at an energy of between about 0.4 kiloelectron-volts (keV) and about 0.6 kiloelectron-volts. In an embodiment, a dose of the boron is about $4.5 \times 10^{16}$ atoms per centimeter squared. In an embodiment, a process time of the plasma doping 66 in FIG. 11 is less than about fifteen (15) seconds.

Figure 12:
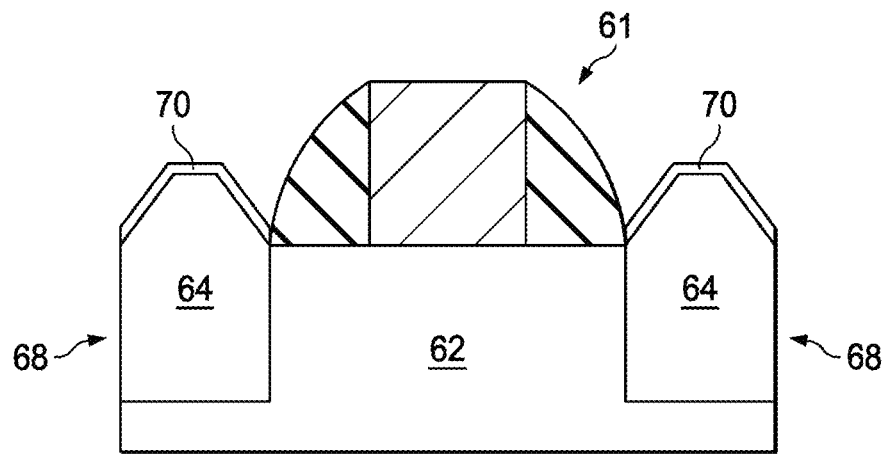

After the plasma doping 66 has been performed, a silicide layer 70 is formed over the source/drain region 40 as shown in FIG. 12. In an embodiment, the silicide layer 70 has a depth of about eight to about twelve nanometers. The silicide layer 70 may have other depths in other embodiments or in other devices.

In an embodiment, a concentration of the boron in the source/drain region 68 beneath the silicide layer 70 is between about $3.0 \times 10^{15}$ atoms per centimeter cubed and about $1.0 \times 10^{16}$ atoms per centimeter cubed.

After the silicide layer 70 has been formed, an anneal process is performed. As will be more fully explained below, the anneal process permits portions of the source/drain regions 64 damaged during doping to be recrystallized or repaired.

In an embodiment, the anneal process comprises a millisecond anneal. In an embodiment, the millisecond anneal is performed using a laser anneal (LSA), at a temperature of about 900° C. to about 1200° C., and for a time of about 10 microseconds (μs) to about 2 milliseconds (ms). In an embodiment, the millisecond anneal is performed using a flash anneal (uSSA), at a temperature of about 700° C. to about 1000° C., and for a time of about 0.8 ms to about 5 ms.

In an embodiment, the anneal process comprises a microwave anneal. In an embodiment, the microwave anneal is performed using a free carrier absorption technique. In an embodiment, the microwave anneal is performed using a dipole resonance heating. In an embodiment, the microwave anneal is performed at a temperature of about 300° C. to about 600° C., and for a time of about 30 seconds to about 300 seconds.

In an embodiment, the pre-amorphization doping permits the anneal process to be performed at a relatively low temperature such as, for example, between about 400° C. to about 600° C. Notably, when the pre-amorphization doping process is employed a more defect rich area will be formed, which will enhance the microwave reaction with the doped area.

Figure 13:
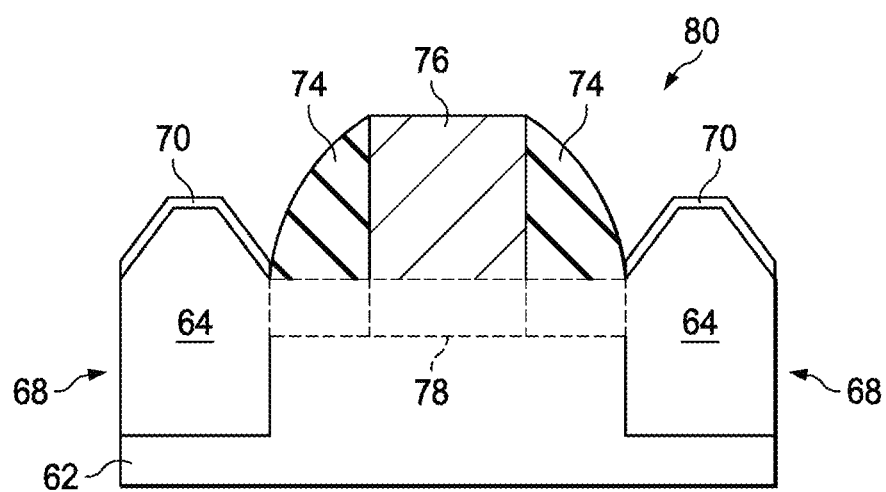

Thereafter, the protective feature 61 (e.g., the dummy gate) of FIG. 12 may be removed using a conventional removal process and then replaced with the metal gate or a gate electrode structure 80 as shown in FIG. 13 using a conventional gate formation process. As shown in FIG. 13, the gate electrode structure 76 and the spacers 74 are disposed over fins 78 adjacent the source/drain regions 64 to form a channel in the FinFET 80.

Those skilled in the art will recognized that further or additional processing steps may be taken to form the FinFET 80 of FIG. 13. In addition, the FinFET 80 of FIG. 13 may contain or include additional materials, features, and layers in different embodiments.

In an embodiment, the process depicted in FIGS. 9-13 may be performed in addition to the process depicted in FIGS. 3-8 in order to form a device with both PMOS and NMOS transistors. In an embodiment, the process of FIGS. 9-13 may be performed first, followed by the process of FIGS. 3-8. In another embodiment, the process of FIGS. 3-8 may be performed first, followed by the process of FIGS. 9-13.

Figure 14:
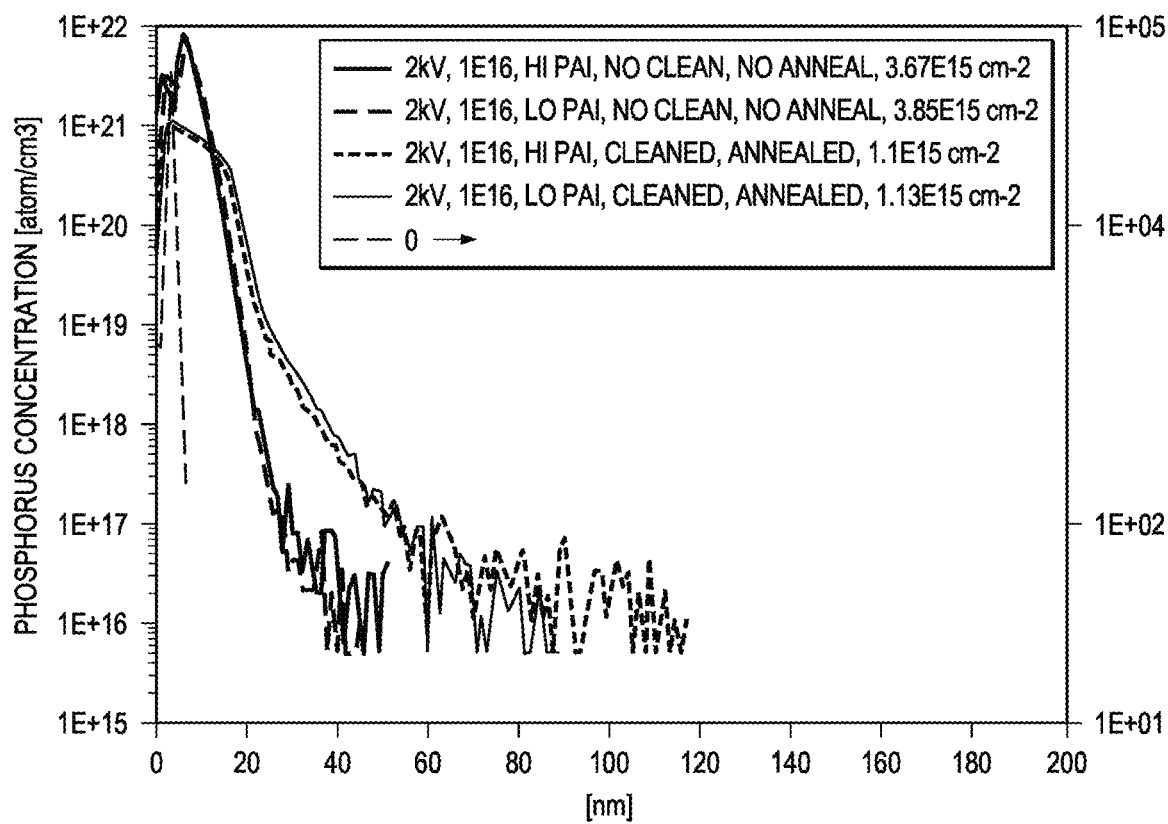
FIG. 14 is a graph illustrating the concentration of phosphorus determined using secondary ion mass spectrometry (SIMS)

Referring now to FIG. 14, a graph 90 illustrating the concentration of phosphorus, which is determined using secondary ion mass spectrometry (SIMS), is provided. As a practical matter, the peak doping concentration of the phosphorous is measured at a depth below the surface (e.g., about 8-12 nanometers) to minimize surface noise effects.

As shown in FIG. 14, the chart includes four curves representing the phosphorus concentration (Y-axis) relative to the depth of the source/drain (X-axis). As shown, each of the curves was produced using an energy or bias of 2 kV. Two of the curves were produced using a "Lo PAI" while the other two curves were produced using a "Hi PAI". As used herein, the Lo PAI means a dose of helium of $1.0 \times 10^{16}$ atoms per centimeter squared and the Hi PAI means a dose of helium above that amount. Continuing, two of the curves were produced where no clean was performed, while the other two curves were produced after a clean of the surface of the source/drain region was performed.

As is well known in the art, the dose of the phosphorus retained in the silicon is lower than the dose of the phosphorus doped in the silicon (e.g., $1.0 \times 10^{16}$ atoms per centimeter squared). For the illustrated doping conditions in FIG. 14, the dose of the phosphorus retained in the source/drain was calculated from the curves to be $3.67 \times 10^{15}$ atoms per centimeter squared, $3.85 \times 10^{15}$ atoms per centimeter squared, $1.1 \times 10^{15}$ atoms per centimeter squared, and $1.13 \times 10^{15}$ atoms per centimeter squared.

Still referring to FIG. 14, when the process conditions were Hi PAI, 2 kV bias, a dose of $1.0 \times 10^{16}$ atoms per centimeter squared, with no clean and no anneal, the junction depth at a phosphorus concentration of $5 \times 10^{18}$ atoms per centimeter cubed was measured to be 19.5 nanometers. In this context, junction depth refers to the junction between the phosphorous and boron (not shown) at $5 \times 10^{18}$ atoms per centimeter cubed. Notably, the junction depth could have been measured at other phosphorus concentrations. Indeed, the point is simply to make all measurements at the same concentration to provide a consistent reference point for comparison purposes.

As shown in FIG. 14, the abruptness (abr) of the junction was found to be 3.5 nanometers per decade. In other words, the slope of the curve at the phosphorus concentration of $5 \times 10^{18}$ atoms per centimeter squared was 3.5 nanometers per decade.

When the process conditions were Lo PAI, 2 kV bias, a phosphorus dose of $1.0 \times 10^{16}$ atoms per centimeter squared, with no clean and no anneal, the junction at a phosphorus concentration of $5 \times 10^{18}$ atoms per centimeter squared was measured to be 19.7 nanometers. In addition, the abruptness of the junction was found to be 2.8 nanometers per decade.

When the process conditions were Hi PAI, 2 kV bias, a phosphorus dose of $1.0 \times 10^{16}$ atoms per centimeter squared, with a clean and an anneal, the sheet resistance was measured at 406.24 ohms per square centimeter and the junction at a phosphorus concentration of $5 \times 10^{18}$ atoms per centimeter squared was measured to be 25 nanometers. In addition, the abruptness of the junction was found to be 5.5 nanometers per decade.

When the process conditions were Lo PAI, 2 kV bias, a phosphorus dose of $1.0 \times 10^{16}$ atoms per centimeter squared, with a clean and an anneal, the sheet resistance was measured at 381.94 ohms per square centimeter and the junction at a phosphorus concentration of $5 \times 10^{18}$ atoms per centimeter squared was measured to be 28 nanometers. In addition, the abruptness of the junction was found to be 7.6 nanometers per decade. As the measurements show, a desirable abruptness at the junction can be achieved using the embodiment process disclosed herein.

In an embodiment, the desired concentration of phosphorus was between about $1.0 \times 10^{21}$ atoms per centimeter cubed and about $5.0 \times 10^{21}$ atoms per centimeter cubed at a depth of about eight nanometers to about ten nanometers. As the graph 90 of FIG. 14 illustrates, the actual concentration of phosphorus was between about $1.0 \times 10^{21}$ atoms per centimeter cubed and about $3.0 \times 10^{21}$ atoms per centimeter cubed at a depth of about eight nanometers to about ten nanometers when a process similar to that depicted in FIGS. 3-8 was employed to form the source/drain regions. As illustrated in FIG. 14, even after the clean and anneal steps have been performed a suitably abrupt junction (abr) of either 5.5 nanometers per decade or 7.6 nanometers per decade is achieved.

By generating a concentration of phosphorous within the desired range at a depth of about 8-10 nanometers into the source/drain region after the silicide layer has been formed, the source/drain resistance is desirably or beneficially reduced. As noted above, the depth of 8-10 nanometers is chosen to mitigate surface noise effects, corresponds to the depth of the silicide, and corresponds to a location of the Schottky barrier at the junction of the silicide and the underlying doped source/drain material. In an embodiment, the source/drain resistance is reduced between about 30% to about 70% percent. As can be seen in FIG. 8 and FIG. 13, where the source/drain epitaxy 34/64 protrudes higher than a top surface of the substrate, the silicide 42/70 can be formed higher than the top surface of the substrate. Consequently, at least a portion of the junction can also be formed higher than the top surface of the substrate.

Figure 15:
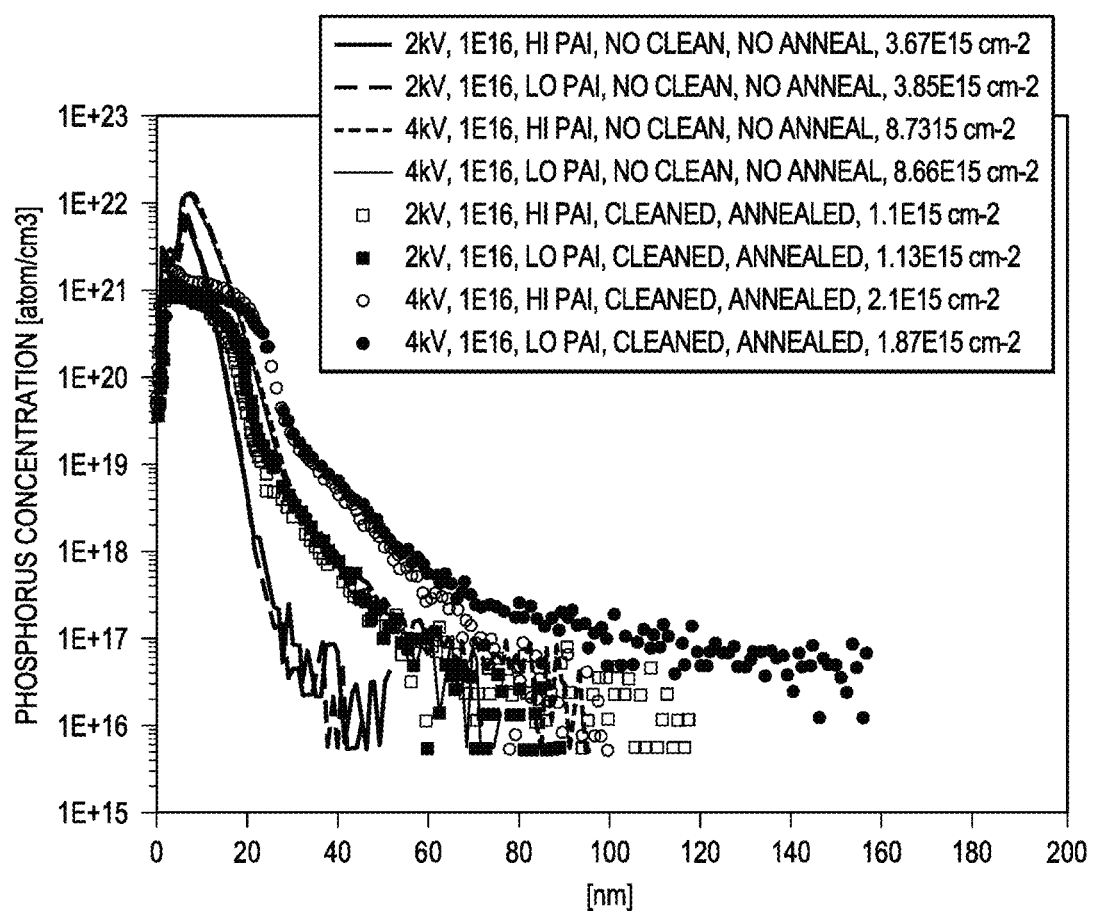
FIG. 15 is a graph illustrating the concentration of phosphorus determined using SIMS.

Referring now to FIG. 15, another graph 92 illustrating the concentration of phosphorus is provided. Similar to FIG. 14, the graph 92 includes several curves representing the phosphorus concentration (Y-axis) relative to the depth of the source/drain (X-axis). As shown, each of the curves was produced using an energy or bias of 2 kV or 4 kV. In addition, the curves reflect using either a Hi PAI or Lo PAI, employing a clean or not, and employing an anneal or not. For the illustrated doping conditions in FIG. 15, the dose of the phosphorus retained in the source/drain was calculated from the curves to be $3.67 \times 10^{15}$ atoms per centimeter squared, $3.85 \times 10^{15}$ atoms per centimeter squared, $8.73 \times 10^{15}$ atoms per centimeter squared, $8.66 \times 10^{15}$ atoms per centimeter squared, $1.1 \times 10^{15}$ atoms per centimeter squared, $1.13 \times 10^{15}$ atoms per centimeter squared, $2.1 \times 10^{15}$ atoms per centimeter squared, and $1.87 \times 10^{15}$ atoms per centimeter squared. As shown in FIG. 15, the curves illustrate that, depending on the process conditions chosen, a suitable abruptness (abr) at a phosphorus concentration of between about $1.0 \times 10^{22}$ atoms per centimeter cubed and about $5.0 \times 10^{21}$ atoms per centimeter cubed and a junction depth at about 8-10 nanometers is achievable.

In an embodiment, the desired concentration of phosphorus was between about $1.0 \times 10^{21}$ atoms per centimeter cubed and about $5.0 \times 10^{21}$ atoms per centimeter cubed at a depth of about eight nanometers to about ten nanometers. As the graph 92 illustrates, the actual concentration of phosphorus was between about $1.0 \times 10^{21}$ atoms per centimeter cubed and about $3.0 \times 10^{21}$ atoms per centimeter cubed at a depth of about eight nanometers to about ten nanometers when a process similar to that depicted in FIGS. 3-8 was employed to form the source/drain regions.

Figure 16:
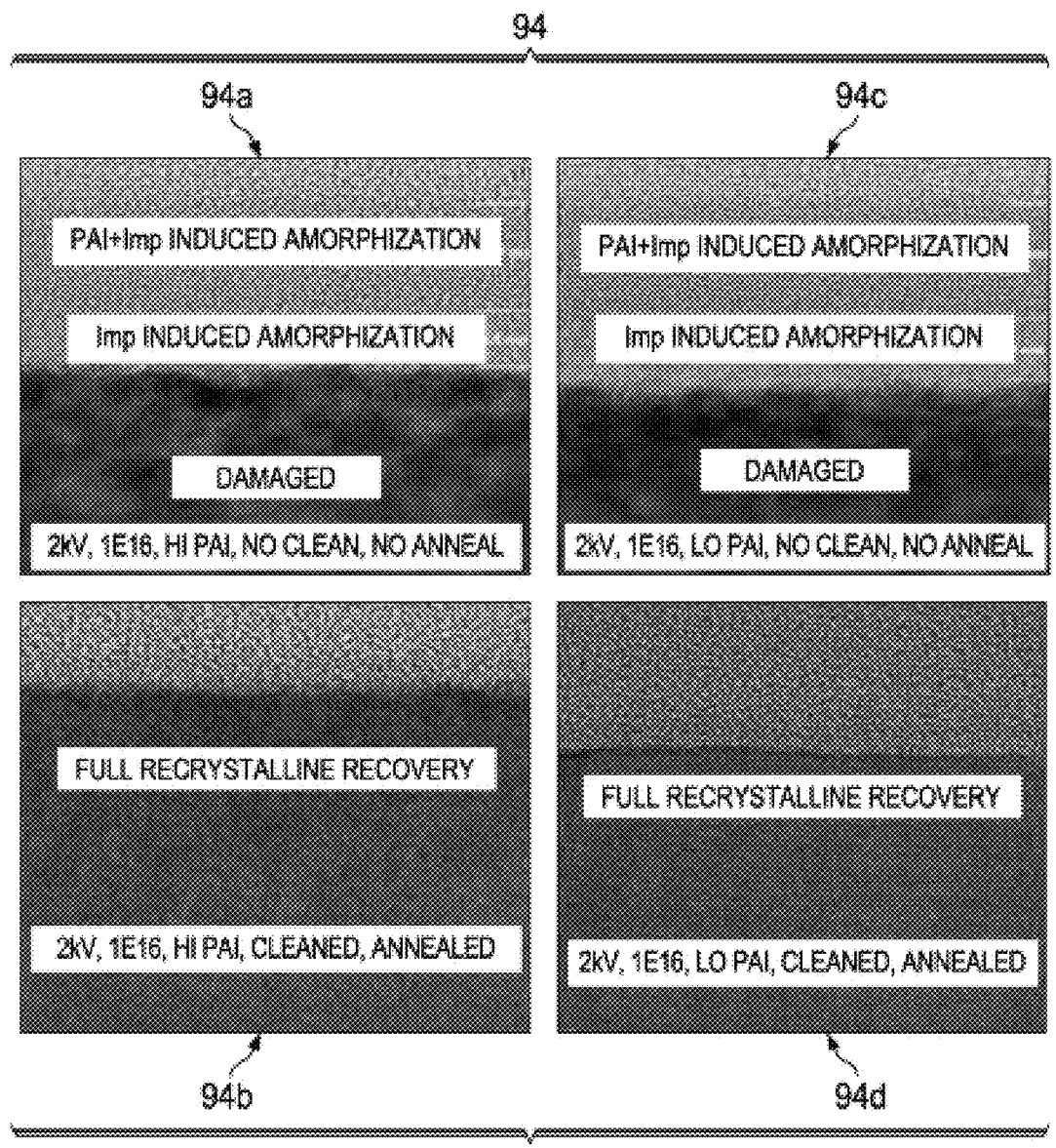
FIG. 16 is a series of images obtained by a transmission electron microscope (TEM).

Referring now to FIG. 16, a series of images 94 obtained by a transmission electron microscope (TEM) are provided. As will be more fully explained below, the image 94a illustrates an image of the source/drain region in an intermediate stage of formation where damage is still present. The corresponding image 94b illustrates the source/drain region after the damage in the image 94a has been repaired by the anneal process. Likewise, the image 94c illustrates an image of the source/drain region in an intermediate stage of formation where damage is still present. The corresponding image 94d illustrates the source/drain region after the damage in the image 94c has been repaired by the anneal process. The anneal process is able to provide the full recrystalline recovery in the images 94b, 94d because the embodiment doping processes described herein were employed.

Still referring to FIG. 16, the process conditions for the top left image were an energy of 2 kV, a phosphorus dose of $1.0 \times 10^{16}$ atoms per centimeter squared, a Hi PAI, with no clean and no anneal. The process conditions for the top right image were an energy of 2 kV, a phosphorus dose of $1.0 \times 10^{16}$ atoms per centimeter squared, a Lo PAI, with no clean and no anneal.

The process conditions for the bottom left image were an energy of 2 kV, a phosphorus dose of $1.0 \times 10^{16}$ atoms per centimeter squared, a Hi PAI, with a clean and an anneal. The process conditions for the bottom right image were an energy of 2 kV, a phosphorus dose of $1.0 \times 10^{16}$ atoms per centimeter squared, a Lo PAI, with a clean and an anneal. In contrast to the top two images, which illustrate damage, the bottom two images illustrate a full recrystalline recovery when embodiment processes as disclosed herein are used. In other words, a full recrystallization may be achieved by way of the anneal.

From the foregoing, with regard to the process depicted in FIGS. 3-8 and 9-13, it should be recognized that the plasma doping of the helium may act as a buffer layer to retard or prevent post-plasma doping phosphorous dopant diffusion. In addition, the phosphorus dopant abruptness of less than about three nanometers per decade may be retained, as shown in FIGS. 14-15.

In addition, when the plasma doping of the phosphorous is performed after the PAI plasma doping of the helium, the energy and dose may be tuned to achieve a desired phosphorous concentration at a desired depth to provide a source/drain resistance (Rcsd) reduction after silicide formation. For example, the phosphorous concentration may be between about $2.0 \times 10^{21}$ atoms/cm$^3$ and about $4.0 \times 10^{21}$ atoms/cm$^3$ at a depth of between about eight nanometers to about twelve nanometers into the source/drain region after the silicide layer has been formed for suitable or desirable source/drain resistance reduction.

With regard to the process depicted in FIGS. 9-13, it should be recognized that a fast doping time (e.g., under 15 seconds) may be achieved by simultaneously doping the boron and the helium. In addition, an abrupt junction of less than about 0.5 nanometers per decade may be achieved, which fulfills the short channel effect (SCE) requirement. Further, an ion gain performance of between about 3-5% may be realized.

One embodiment is a device including a first channel region and a first gate structure formed over the first channel region. A first source/drain region is formed on either side of the first channel region and the first source/drain region includes a defect-free crystalline structure doped with a first dopant. A first silicide is formed over the first source/drain region. The first source/drain region includes a first junction and a concentration of the first dopant at the first junction is between $2.0 \times 10^{21}$ atoms per centimeter cubed and $4.0 \times 10^{21}$ atoms per centimeter cubed at a depth of 8 to 10 nanometers. A gradient of decreasing concentration of the first dopant is one decade for every 5.5 to 7.5 nanometers of the first source/drain region deeper than the first junction.

Another embodiment is a semiconductor device including a first gate formed over a substrate and a first source/drain region formed on opposing sides of the first gate. The first source/drain region includes an epitaxial semiconductor material doped with a first impurity at a first concentration, where the first impurity is a p-type impurity. The first source/drain region has a first portion formed within the substrate. A first silicide is formed on the first source/drain region and has a thickness of 8 to 10 nm. A second concentration of the first impurity at a first interface of the first silicide and first source/drain region is between $3.0 \times 10^{15}$ atoms per centimeter cubed and $1.0 \times 10^{16}$ per centimeter cubed. A gradient of a concentration of the first impurity in the first source/drain region decreases at about 1 decade per 0.5 nm depth into the first source/drain region from the first interface.

Another embodiment is a semiconductor device including a substrate, a first gate formed over the substrate, first source/drain regions formed on either side of the first gate within the substrate, a second gate formed over the substrate, and second source/drain regions formed on either side of the second gate within the substrate. The first source/drain regions are doped with a first dopant and the second source/drain regions are doped with a second dopant. A first junction in the first source/drain regions is formed at a depth of 8 to 10 nm, where a concentration of first dopant at the first junction is between $2.0 \times 10^{21}$ atoms per cm$^3$ and $4.0 \times 10^{21}$ atoms per cm$^3$. The concentration of first dopant decreases deeper into the first source/drain regions from the first junction at a first abruptness, where the first abruptness corresponds to one decade concentration for every 5.5 to 7.5 nm. A second junction in the second source/drain regions is formed at a depth of 8 to 10 nm, where a concentration of second dopant at the second junction is between $3.0 \times 10^{15}$ atoms per cm$^3$ and $1.0 \times 1016$ atoms per cm$^3$.

One embodiment is a device including a first channel region and a first gate structure formed over the first channel region. A first source/drain region is formed on either side of the first channel region and the first source/drain region includes a defect-free crystalline structure doped with a first dopant. A first silicide is formed over the first source/drain region. The first source/drain region includes a first junction and a concentration of the first dopant at the first junction is between $2.0 \times 10^{21}$ atoms per centimeter cubed and $4.0 \times 10^{21}$ atoms per centimeter cubed at a depth of 8 to 10 nanometers. A gradient of decreasing concentration of the first dopant is one decade for every 5.5 to 7.5 nanometers of the first source/drain region deeper than the first junction.

Another embodiment is a semiconductor device including a first gate formed over a substrate and a first source/drain region formed on opposing sides of the first gate. The first source/drain region includes an epitaxial semiconductor material doped with a first impurity at a first concentration, where the first impurity is a p-type impurity. The first source/drain region has a first portion formed within the substrate. A first silicide is formed on the first source/drain region and has a thickness of 8 to 12 nm. A second concentration of the first impurity at a first interface of the first silicide and first source/drain region is between $3.0 \times 10^{15}$ atoms per centimeter cubed and $1.0 \times 10^{16}$ per centimeter cubed. A gradient of a concentration of the first impurity in the first source/drain region decreases at about 1 decade per 0.5 nm depth into the first source/drain region from the first interface.

Another embodiment is a semiconductor device including a substrate, a first gate formed over the substrate, first source/drain regions formed on either side of the first gate within the substrate, a second gate formed over the substrate, and second source/drain regions formed on either side of the second gate within the substrate. The first source/drain regions are doped with a first dopant and the second source/drain regions are doped with a second dopant. A first junction in the first source/drain regions is formed at a depth of 8 to 10 nm, where a concentration of first dopant at the first junction is between $2.0 \times 10^{21}$ atoms per cm$^3$ and $4.0 \times 10^{21}$ atoms per cm$^3$. The concentration of first dopant decreases deeper into the first source/drain regions from the first junction at a first abruptness, where the first abruptness corresponds to one decade concentration for every 5.5 to 7.5 nm. A second junction in the second source/drain regions is formed at a depth of 8 to 12 nm, where a concentration of second dopant at the second junction is between $3.0 \times 10^{15}$ atoms per cm$^3$ and $1.0 \times 10^{16}$ atoms per cm$^3$.

Another embodiment method of forming a source/drain region for a transistor is provided. The method includes forming a recess in a substrate and epitaxially growing a semiconductor material in the recess. The method also includes amorphizing the semiconductor material and doping the semiconductor material with a dopant to form the source/drain region.

Another embodiment method of forming a source/drain region for a transistor includes forming a recess in a substrate, epitaxially growing a semiconductor material in the recess, performing a pre-amorphization doping of the semiconductor material using a first plasma doping, and doping the semiconductor material with phosphorus using a second plasma doping to form the source/drain region.

Another embodiment method of forming source/drain regions includes forming a recess in a substrate, epitaxially growing a semiconductor material in the recess, a doping the semiconductor material with boron and helium using plasma doping to form the source/drain region.

Another embodiment is a method including forming a first recess in a substrate and epitaxially growing a first source/drain region in the first recess. A first pre-amorphization implant to the first source/drain region is performed. Following the first pre-amorphization implant, the first source/drain region is doped with a first dopant. An anneal is performed to recrystallize the first source/drain region, where following the anneal a peak concentration of the first dopant at a first depth of the first source/drain region is between about $2.0 \times 10^{21}$ atoms per cm$^3$ and about $4.0 \times 10^{21}$ atoms per cm$^3$, where the first depth is between about 8 to 10 nm.

Another embodiment is a method including forming a first recess in a substrate and epitaxially growing a first source/drain region in the first recess A first pre-amorphization implant to the first source/drain region is performed. Following the first pre-amorphization implant, the first source/drain region is doped with a first dopant. An anneal is performed to recrystallize the first source/drain region, where following the anneal a peak concentration of the first dopant at a first depth of the first source/drain region is between about $3.0 \times 10^{15}$ atoms per cm$^3$ and $1.0 \times 10^{16}$ per cm$^3$, where the first depth is between about 8 to 10 nm from a surface of the first source/drain region.

Another embodiment is a method including forming a first semiconductor fin and a second semiconductor fin, a first gate structure over a first channel region of the first semiconductor fin, the first gate structure having a lengthwise direction perpendicular to the first semiconductor fin, and forming a second gate structure over a second channel region of the second semiconductor fin, the second gate structure having a lengthwise direction perpendicular to the second semiconductor fin. A first recess is formed in the first semiconductor fin adjacent the first gate structure and a second recess is formed in the second semiconductor fin adjacent the second gate structure. A first source/drain epitaxy is formed in the first recess and a second source/drain epitaxy is formed in the second recess. A first pre-amorphization implant to the first source/drain epitaxy and the second source/drain epitaxy is performed. Following the first pre-amorphization implant, the first source/drain epitaxy is doped with a first dopant and the second source/drain epitaxy is doped with a second dopant. An anneal to recrystallize the first source/drain epitaxy and to recrystallize the second source/drain epitaxy is performed, where following the anneal a first peak concentration of the first dopant at a first depth of the first source/drain epitaxy is between about $3.0 \times 10^{15}$ atoms per cm$^3$ and $1.0 \times 10^{16}$ per cm$^3$ and a second peak concentration of the second dopant at a second depth of the second source/drain epitaxy is between about $2.0 \times 10^{21}$ atoms per cm$^3$ and about $4.0 \times 10^{21}$ atoms per cm$^3$, where the first depth and second depth are each between about 8 to 10 nm.

Another embodiment is a method including forming a first recess in a substrate. The method also includes epitaxially growing a first source/drain region in the first recess. The method also includes performing a first pre-amorphization implant to the first source/drain region. Following the first pre-amorphization implant, the first source/drain region is doped with a first dopant. An anneal is performed to recrystallize the first source/drain region, where following the anneal a peak concentration of the first dopant is at a first depth of the first source/drain region, the first depth being between 8 nm and 10 nm, where a concentration of the first dopant decreases in a logarithmic gradient deeper than the first depth. In an embodiment, the logarithmic gradient of decreasing concentration of the first dopant is one decade for every 5.5 to 7.5 nm deeper than the first depth. In an embodiment, the first dopant is an n-type impurity. In an embodiment, the first depth corresponds to an interface between the first source/drain region and the silicide. In an embodiment, following the anneal a second peak concentration of the second dopant is at a second depth of the second source/drain region, the second depth being between 8 nm and 10 nm, where a concentration of the second dopant decreases in a second logarithmic gradient deeper than the second depth. In an embodiment, the second logarithmic gradient of decreasing concentration of the second dopant is one decade for about every 0.5 nm deeper than the second depth. In an embodiment, the second dopant is a p-type impurity. In an embodiment, the second depth corresponds to an interface between the second source/drain region and the silicide. In an embodiment, the second logarithmic gradient is different than the first logarithmic gradient.

Another embodiment is a method including forming a first recess in a substrate. The method also includes epitaxially growing a first source/drain region in the first recess. A first pre-amorphization implant to the first source/drain region is performed. The first source/drain region is doped with a first dopant. An anneal is performed to recrystallize the first source/drain region, where following the anneal, a peak concentration of the first dopant is at a first depth of the first source/drain region, the first depth being between 8 nm and 10 nm, where a concentration of the first dopant decreases logarithmically every 0.5 nm. In an embodiment, the method where following the anneal the peak concentration of the first dopant is between about $3.0 \times 10^{15}$ atoms per cm$^3$ and $1.0 \times 10^{16}$ per cm$^3$. In an embodiment, the first dopant is a p-type impurity. In an embodiment, the first depth corresponds to an interface between the first source/drain region and the silicide. In an embodiment, the first recess is formed adjacent the first gate structure, the first gate structure formed over a channel region of a transistor. In an embodiment, the first source/drain region has a first portion that protrudes above the substrate, where a portion of the first depth is vertically higher than an uppermost point of the channel region.

Another embodiment is a method including forming a first source/drain epitaxy adjacent a first gate structure. The method also includes forming a second source/drain epitaxy adjacent a second gate structure. A first pre-amorphization implant to the first source/drain epitaxy and the second source/drain epitaxy is performed. The first source/drain epitaxy is doped with a first dopant and the second source/drain epitaxy with a second dopant. An anneal is performed to recrystallize the first source/drain epitaxy and to recrystallize the second source/drain epitaxy, where following the anneal a first peak concentration of the first dopant is at a first depth of the first source/drain epitaxy and a second peak concentration of the second dopant is at a second depth of the second source/drain epitaxy, the first depth and second depth each between about 8 to 10 nm. In an embodiment, following the anneal, a first gradient of decreasing concentration of the first dopant from the first depth is different than a second gradient of decreasing concentration of the second dopant from the second depth. In an embodiment, the first gradient of decreasing concentration of the first dopant is one decade for about every 0.5 nm deeper than the first depth. In an embodiment, the second gradient of decreasing concentration of the second dopant is one decade for every 5.5 to 7.5 nm deeper than the second depth. In an embodiment, the first depth corresponds to a first interface between the first source/drain epitaxy and the first silicide. In an embodiment, the method includes forming a second silicide from the second source/drain epitaxy, where the second depth corresponds to a second interface between the second source/drain epitaxy and the second silicide.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method comprising:
   forming a first recess in a substrate;
   epitaxially growing a first source/drain region in the first recess;
   performing a first pre-amorphization implant to the first source/drain region;
   following the first pre-amorphization implant, doping the first source/drain region with a first dopant; and
   performing an anneal to recrystallize the first source/drain region, wherein following the anneal a peak concentration of the first dopant is at a first depth of the first source/drain region, the first depth being between 8 nm and 10 nm, wherein a concentration of the first dopant decreases in a logarithmic gradient deeper than the first depth.

2. The method of claim 1, wherein the logarithmic gradient of decreasing concentration of the first dopant is one decade for every 5.5 to 7.5 nm deeper than the first depth.

3. The method of claim 1, wherein the first dopant is an n-type impurity.

4. The method of claim 1, further comprising: forming a silicide in the first source/drain region, and wherein the first depth corresponds to an interface between the first source/drain region and the silicide.

5. The method of claim 1, further comprising:
   forming a second recess in the substrate;
   epitaxially growing a second source/drain region in the second recess;
   performing a second pre-amorphization implant to the second source/drain region; and
   doping the second source/drain region with a second dopant, wherein following the anneal a second peak concentration of the second dopant is at a second depth of the second source/drain region, the second depth being between 8 nm and 10 nm, wherein a concentration of the second dopant decreases in a second logarithmic gradient deeper than the second depth.

6. The method of claim 5, wherein the second logarithmic gradient of decreasing concentration of the second dopant is one decade for about every 0.5 nm deeper than the second depth.

7. The method of claim 5, wherein the second dopant is a p-type impurity.

8. The method of claim 5, further comprising: forming a silicide in the second source/drain region, wherein the second depth corresponds to an interface between the second source/drain region and the silicide.

9. The method of claim 5, wherein the second logarithmic gradient is different than the first logarithmic gradient.

10. A method comprising:
    forming a first recess in a substrate;
    epitaxially growing a first source/drain region in the first recess;
    performing a first pre-amorphization implant to the first source/drain region;
    doping the first source/drain region with a first dopant; and
    performing an anneal to recrystallize the first source/drain region, wherein following the anneal, a peak concentration of the first dopant is at a first depth of the first source/drain region, the first depth being between 8 nm and 10 nm, wherein a concentration of the first dopant decreases logarithmically every 0.5 nm.

11. The method of claim 10, wherein following the anneal the peak concentration of the first dopant is between about $3.0 \times 10^{15}$ atoms per $cm^3$ and $1.0 \times 10^{16}$ per $cm^3$.

12. The method of claim 10, wherein the first dopant is a p-type impurity.

13. The method of claim 10, further comprising: forming a silicide in the first source/drain region wherein, wherein the first depth corresponds to an interface between the first source/drain region and the silicide.

14. The method of claim 10, further comprising:
    forming a first gate structure over the substrate, wherein the first recess is formed adjacent the first gate structure, the first gate structure formed over a channel region of a transistor.

15. The method of claim 14, wherein the first source/drain region has a first portion that protrudes above the substrate, wherein a portion of the first depth is vertically higher than an uppermost point of the channel region.

16. A method comprising:
    forming a first source/drain epitaxy adjacent a first gate structure;
    forming a second source/drain epitaxy adjacent a second gate structure;
    performing a first pre-amorphization implant to the first source/drain epitaxy and the second source/drain epitaxy;
    doping the first source/drain epitaxy with a first dopant and the second source/drain epitaxy with a second dopant; and
    performing an anneal to recrystallize the first source/drain epitaxy and to recrystallize the second source/drain epitaxy, wherein following the anneal a first peak concentration of the first dopant is at a first depth of the first source/drain epitaxy and a second peak concentration of the second dopant is at a second depth of the second source/drain epitaxy, the first depth and second depth each between about 8 to 10 nm.

17. The method of claim 16, wherein following the anneal, a first gradient of decreasing concentration of the first dopant from the first depth is different than a second gradient of decreasing concentration of the second dopant from the second depth.

18. The method of claim 17, wherein the first gradient of decreasing concentration of the first dopant is one decade for about every 0.5 nm deeper than the first depth.

19. The method of claim 17, wherein the second gradient of decreasing concentration of the second dopant is one decade for every 5.5 to 7.5 nm deeper than the second depth.

20. The method of claim 16, further comprising:
forming a first silicide from the first source/drain epitaxy, wherein the first depth corresponds to a first interface between the first source/drain epitaxy and the first silicide; and
forming a second silicide from the second source/drain epitaxy, wherein the second depth corresponds to a second interface between the second source/drain epitaxy and the second silicide.

* * * * *